(12) United States Patent
Fujiwara et al.

(10) Patent No.: US 7,612,574 B2
(45) Date of Patent: Nov. 3, 2009

(54) SYSTEMS AND METHODS FOR DEFECT TESTING OF EXTERNALLY ACCESSIBLE INTEGRATED CIRCUIT INTERCONNECTS

(75) Inventors: Yoshinori Fujiwara, Tsukuba (JP); Masayoshi Nomura, Ryugasaki (JP)

(73) Assignee: Micron Technology, Inc., Boise, ID (US)

( * ) Notice: Subject to any disclaimer, the term of this patent is extended or adjusted under 35 U.S.C. 154(b) by 377 days.

(21) Appl. No.: 11/627,108

(22) Filed: Jan. 25, 2007

(65) Prior Publication Data

US 2008/0180116 A1 Jul. 31, 2008

(51) Int. Cl.
*G01R 31/28* (2006.01)
*G01R 31/04* (2006.01)

(52) U.S. Cl. ............... 324/763; 324/538; 714/733

(58) Field of Classification Search .......... 324/537, 324/538, 763, 765; 714/733, 734
See application file for complete search history.

(56) References Cited

U.S. PATENT DOCUMENTS

| | | | |
|---|---|---|---|
| 5,457,381 A * | 10/1995 | Farwell | ............... 324/158.1 |
| 5,523,697 A | 6/1996 | Farnworth et al. | |
| 5,592,736 A | 1/1997 | Akram et al. | |
| 6,124,721 A | 9/2000 | Farnworth et al. | |
| 6,199,182 B1 * | 3/2001 | Whetsel | ............... 714/724 |
| 6,380,555 B1 | 4/2002 | Hembree et al. | |
| 6,392,426 B2 | 5/2002 | Farnworth et al. | |
| 6,414,506 B2 | 7/2002 | Akram et al. | |
| 6,614,249 B1 | 9/2003 | Farnworth et al. | |
| 6,657,450 B2 | 12/2003 | Farnworth et al. | |
| 6,701,470 B1 | 3/2004 | Mullarkey et al. | |
| 6,995,581 B2 * | 2/2006 | Barr et al. | ............... 324/763 |

* cited by examiner

*Primary Examiner*—Ernest F Karlsen
(74) *Attorney, Agent, or Firm*—Knobbe Martens Olson & Bear LLP

(57) ABSTRACT

Apparatus and methods provide built-in testing enhancements in integrated circuits. These testing enhancements permit, for example, continuity testing to pads and/or leakage current testing for more than one pad. The disclosed techniques may permit more thorough testing of integrated circuits at the die level, thereby reducing the number of defective devices that are further processed, saving both time and money. In one embodiment, a test signal is routed in real time through a built-in path that includes an input buffer for a pad under test. This permits testing of continuity between the pad and the input buffer. An output buffer can also be tested as applicable. In another embodiment, two or more pads of a die are electronically coupled together such that leakage current testing applied by a probe connected to one pad can be used to test another pad.

13 Claims, 8 Drawing Sheets

SYSTEMS AND METHODS FOR DEFECT TESTING OF EXTERNALLY ACCESSIBLE INTEGRATED CIRCUIT INTERCONNECTS

BACKGROUND

1. Field of the Invention

Embodiments of the invention generally relate to integrated circuits. In particular, embodiments of the invention relate to circuits that facilitate the identification of defective circuits.

2. Description of the Related Art

Integrated circuit (IC) devices are typically tested for defects at various stages of production. Typically, the tests become more complete as the chip progresses through production. While virtually all IC devices are eventually tested thoroughly, it is desirable to catch defects as early as possible, for example, before the die is assembled in a package. Dies for an integrated circuit can also be delivered prior to packaging. For example, multiple memory chips are frequently packaged together in a single package. In addition, multiple dies are frequently combined and assembled in a single package known as a hybrid.

It can be difficult to test an integrated circuit at the die level. For example, physical test equipment limitations, such as the number of test equipment probes available to make contact with pads on the die, can limit the testing of an integrated circuit 100 to spot checks. As illustrated in FIG. 1, a particular test probe 102 may make contact with only one pad 104 of the integrated circuit 100, leaving other pads untested. Time constraints for testing may render it impractical to move the test probe 102 to other pads. While test equipment usually has multiple test probes, the number of pads on a die typically greatly exceeds the number of test probes. Accordingly, only selected pads, such as 1 of 30 or 1 of 100 pads, are typically tested at the die level. Thus, defects can go undetected, and defective die can be delivered, packaged, combined with other chips, or the like.

BRIEF DESCRIPTION OF THE DRAWINGS

These drawings not to scale and the associated description herein are provided to illustrate specific embodiments of the invention and are not intended to be limiting.

DETAILED DESCRIPTION OF EMBODIMENTS

Apparatus and methods provide built-in testing enhancements in integrated circuits. This permits more thorough testing of integrated circuits at the die level. For example, techniques to test continuity between externally accessible interconnects and internal circuitry are disclosed. Also disclosed are techniques to test leakage current of multiple externally accessible interconnects, including one or more externally accessible interconnects not directly probed. While illustrated in the context of pads for the externally accessible interconnects, the skilled artisan will appreciate that the principles and advantages described herein are applicable to other types of externally acessible interconnects. Although particular embodiments are described herein, other embodiments of the invention, including embodiments that do not provide all of the benefits and features set forth herein, will be apparent to those of ordinary skill in the art.

In one embodiment, a test signal is routed in real time within the integrated circuit, including a metallization layer for an input buffer for a pad under test. This permits testing of continuity between the pad and the input buffer. For pads coupled to I/O buffers, the signal can also be routed through the output buffer for testing. During test, both the output buffer and the input buffer are active (enabled) at the same time.

In another embodiment, two or more pads of an integrated circuit are coupled together internal to the integrated circuit such that leakage current testing applied by a probe connected to one pad can be used to test the other pad. This permits relatively more pads to be tested at a time than the number of test probes. Registers can be used to couple various stages of a string of test circuits together, such that a test signal is gradually propagated through the test circuit.

One embodiment provides leakage current testing to pads that are not directly probed by test equipment. For example, built-in circuits can couple two or more pads together for leakage current testing, such that the leakage current testing of one pad simultaneously results in the leakage current testing of two or more pads. The leakage current amount of the probed pad can be subtracted from the combined amount to yield the leakage current of a pad that is not directly probed.

Figure 1:
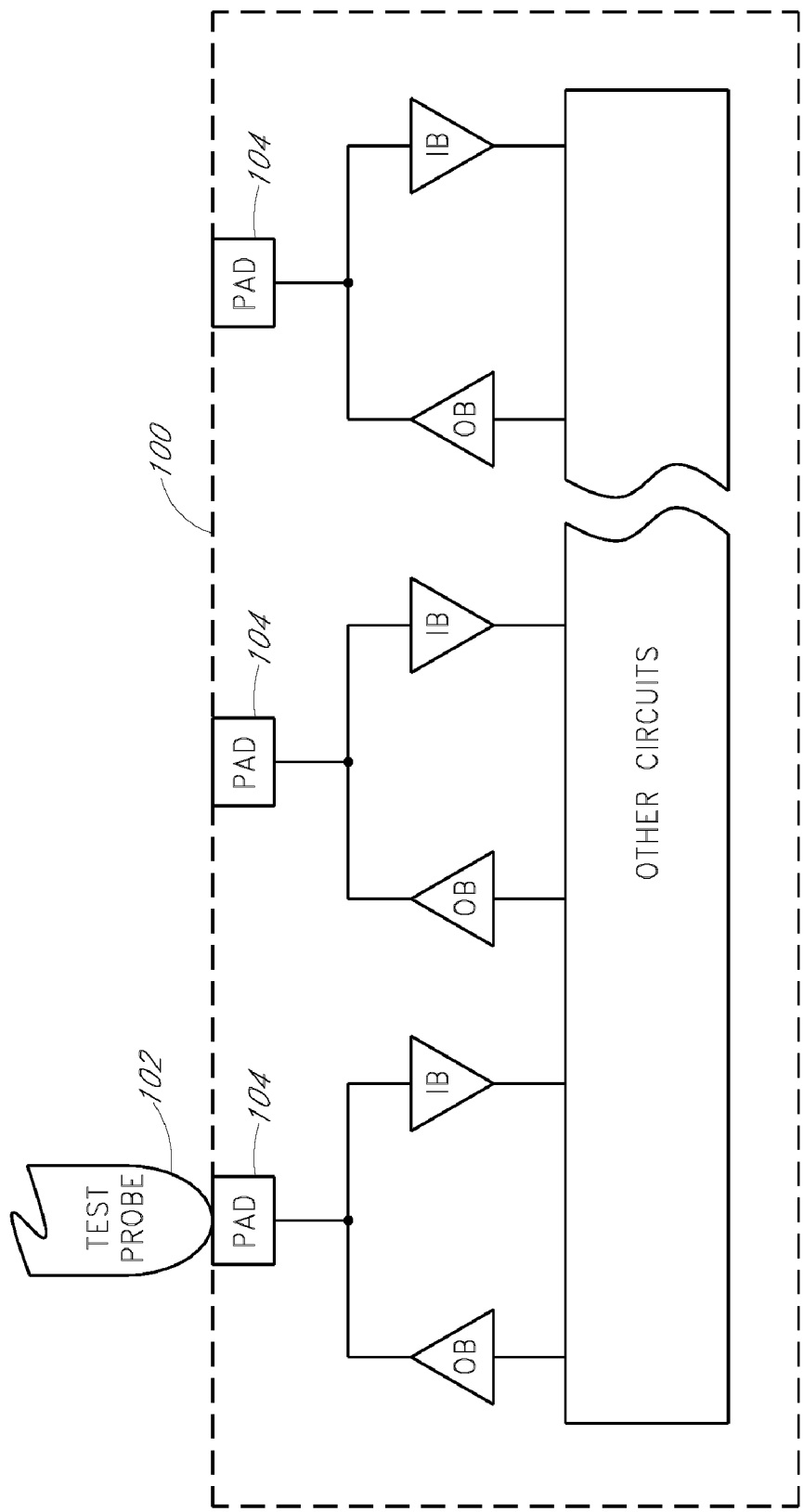
FIG. 1 is a schematic diagram of a test probe making contact with a pad of a conventional integrated circuit.
Figure 2:
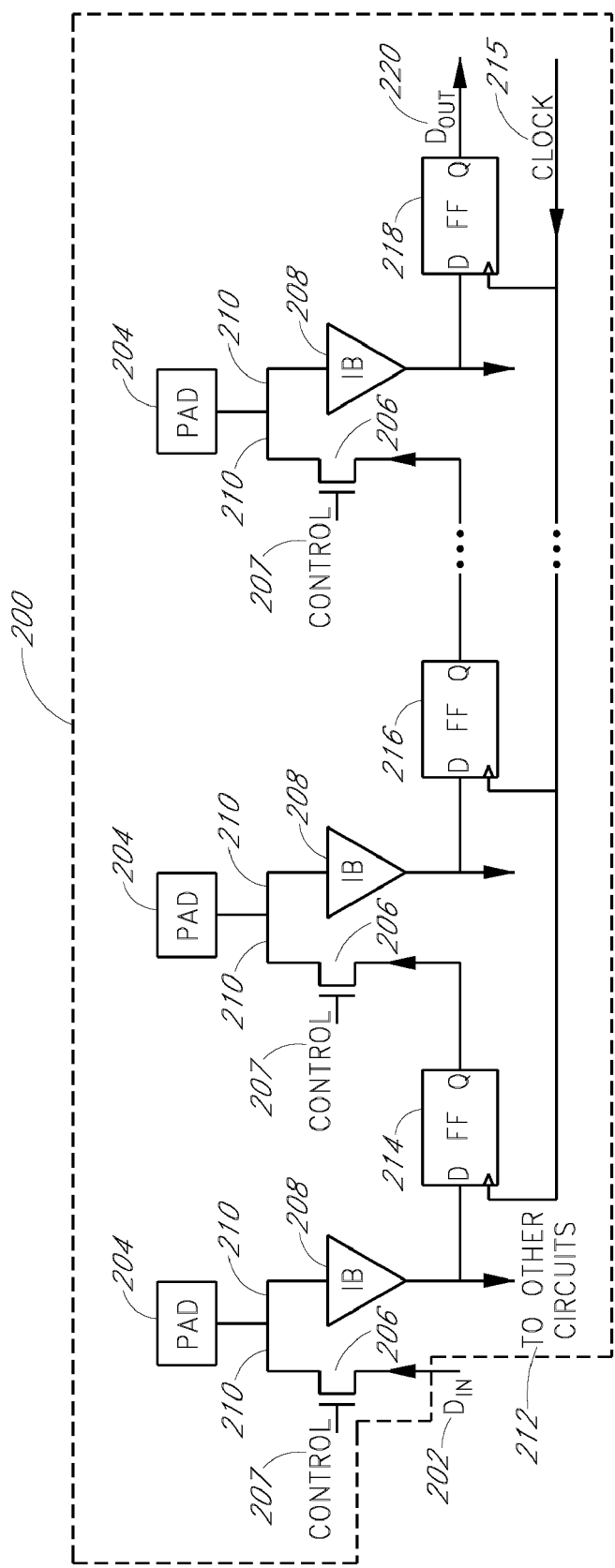
FIG. 2 is a schematic diagram of a circuit that provides effective testing of continuity between externally accessible interconnects, such as pads, and inputs.

FIGS. 2 and 3 are schematic diagrams of circuits that provide testing of continuity to pads. While illustrated separately for clarity, the techniques illustrated in connection with FIGS. 2 and 3 can be combined. In addition, the continuity testing circuits of FIGS. 2 and 3 can also be combined with the leakage current testing circuit depicted in FIG. 6.

Figure 3A:
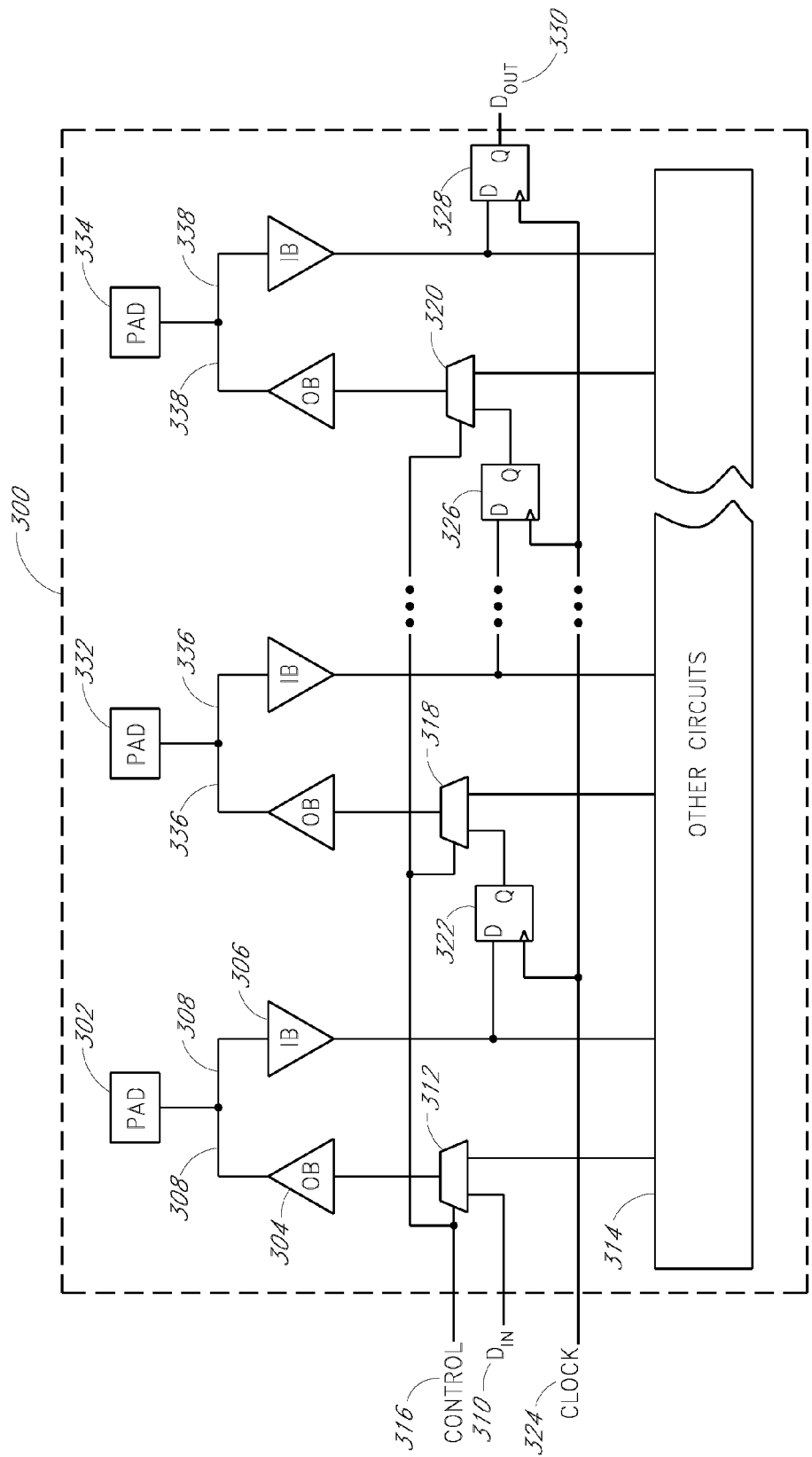
FIG. 3A is a schematic diagram of a circuit that provides effective testing of continuity between externally accessible interconnects, such as pads, and input/output circuits.

The circuit illustrated in FIG. 2 is applicable to input circuits, such as control lines, address lines, etc. The circuit illustrated in FIG. 3A is applicable to input/output circuits, such as data lines. Of course, the circuits can be combined such that both pads for input circuits and pads for input/output circuits are tested in a string. A dashed box indicates the integrated circuit 200. A test probe would lie outside of the integrated circuit 200.

A test signal $D_{in}$ 202 is provided in real time along a path within the integrated circuit 200 to a pad 204. The test signal $D_{in}$ 202 can originate outside of the integrated circuit 200, such as in test equipment. By using the built-in path, a test probe need not touch the pad 204. The test signal $D_{in}$ 202 is coupled to the pad 204 via a switchable device 206, such as a transistor, which can decouple the test signal $D_{in}$ 202 from the pad 204 for normal operation. The skilled practitioner will appreciate that other devices, such as a tri-state gate, can also be used for the switchable device 206.

Typically, the switchable device 206, the pad 204, and an input buffer (IB) 208 for the pad are electrically connected via one or more conductors 210 formed from conductive lines, plugs, and the like. The input buffer 208 can be the same device that would normally be present in the circuit (without the described test circuits). Preferably, the conductors 210 from the switchable device 206 to the pad 204 and from the pad 204 to the input buffer 208 form separate paths for testing of continuity. While the continuity to the pad 204 itself may not be directly tested, the failure rate of connection(s) at the pad 204 itself is relatively low due to the relatively large physical size of the pad 204 such that the disclosed techniques provide a relatively efficient way to test continuity to the pad 204 indirectly.

Many possible sources for the test signal $D_{in}$ 202 exist. For example, the test signal $D_{in}$ 202 can be generated by test equipment external to the integrated circuit 200 and coupled to the integrated circuit 200 or device under test (DUT) via an external test probe. An example of coupling a test signal $D_{in}$ from an external test probe will be described later in connection with FIG. 3B. In another example, the test signal $D_{in}$ 202 can be internally generated within the integrated circuit 200 by a pattern generator or the like. In another example, the test signal $D_{in}$ 202 is provided from a preceding circuit in a "string" or daisy chain of circuits to be tested.

During test, the test signal $D_{in}$ 202 is coupled to the conductors 210 by activation of the switchable device 206, such as by turning the gate of an N-channel transistor "high." For example, a register controlling a test mode for the chip can be coupled to the various switchable devices 206 via a control signal 207 to activate the switchable devices 206. The control signal 207 can originate outside the integrated circuit 200, such as in test equipment. If the conductors 210 for the pad 204 have continuity, the test signal $D_{in}$ 202 should then be coupled to the input of the input buffer 208, and then through the input buffer 208 to the output of the input buffer 208. By monitoring the output of the input buffer 208, a relatively good indication of the continuity of the conductors 210 can be established.

In the illustrated embodiment, the output of the input buffer 208 is coupled to other circuits 212, such as to address decoders, control circuits, etc., which are not necessarily part of the test circuit, and to a register 214, which can optionally form part of the test circuit. For example, the register 214 can be a D-type flip flop. The use of a register between stages of input pads simplifies the cascading of tests for multiple pads, permits the testing of multiple pads to be synchronous with the test signal $D_{in}$ 202, and isolates the input buffer 208 and the other circuits 212 from the test circuit for normal operation. A clock signal 215 provides a reference for synchronous timing. The clock signal 215 can be generated by test equipment outside of the integrated circuit 200.

The number of pads in a string can vary in a very broad range and can be arranged such that all of the pads on a particular integrated circuit 200 can be tested with the available probes of the particular test equipment used. As illustrated in FIG. 2, the output of the register 214 is coupled to another switchable device 206. This provides the test signal $D_{in}$ 202, as propagated through the switchable device 206, the conductors 210, and the input buffer 208, to the next circuit for the next pad 204 to be tested.

Any of the outputs of the registers 214, 216, 218 can be used as a test output signal $D_{out}$ 220 for monitoring of the test signal $D_{in}$ 202, as propagated. In one embodiment, only the register 218 at the end of a string is monitored for the continuity check of all of the pads in the string. For example, the test signal $D_{in}$ 202 can be transitioned, and after an appropriate number of clock cycles of a clock signal 215 as determined by the length of the cascade of registers 214, 216, 218, the test output signal $D_{out}$ 220 observed for a corresponding transition to indicate a test pass. The test output signal $D_{out}$ 220 can be monitored via a variety of techniques, such as, but not limited to, accessing a test pad for test (which may be shared with other functions), temporary storage within the device under test if such memory is available, or the like.

FIG. 3A illustrates another circuit for testing of continuity between pads and input/output lines. A data line for a memory chip is an example of such an input/output line. While the circuit described earlier in connection with FIG. 2 can also be used to test an input/output line, the circuit illustrated in FIG. 3A advantageously provides continuity testing of a conductive path for an output of an output buffer. A dashed box indicates the integrated circuit 300. Test probes and test equipment would lie outside the integrated circuit 300.

FIG. 3A illustrates a pad 302, an output buffer (OB) 304, and an input buffer (IB) 306. Conductors 308 electrically couple the pad 302, the output buffer 304, and the input buffer 306. During normal operating conditions, only one of the output buffer 304 or the input buffer 306 is active, if at all. For example, if the integrated circuit 300 is a memory device, the output buffer 304 is enabled during a memory read cycle, and the input buffer 306 is enabled during a memory write cycle. Uniquely, during a test mode for the integrated circuit 300, both the output buffer 304 and the input buffer 306 are enabled and active. Typically, one of ordinary skill in the art would be careful not to permit the output buffer 304 and the input buffer 306 to be enabled at the same time because the output buffer 304 would then be in contention with an output driver coupled to the pad 302 from outside the integrated circuit 300 that would be providing data for the input buffer 306.

Figure 3B:
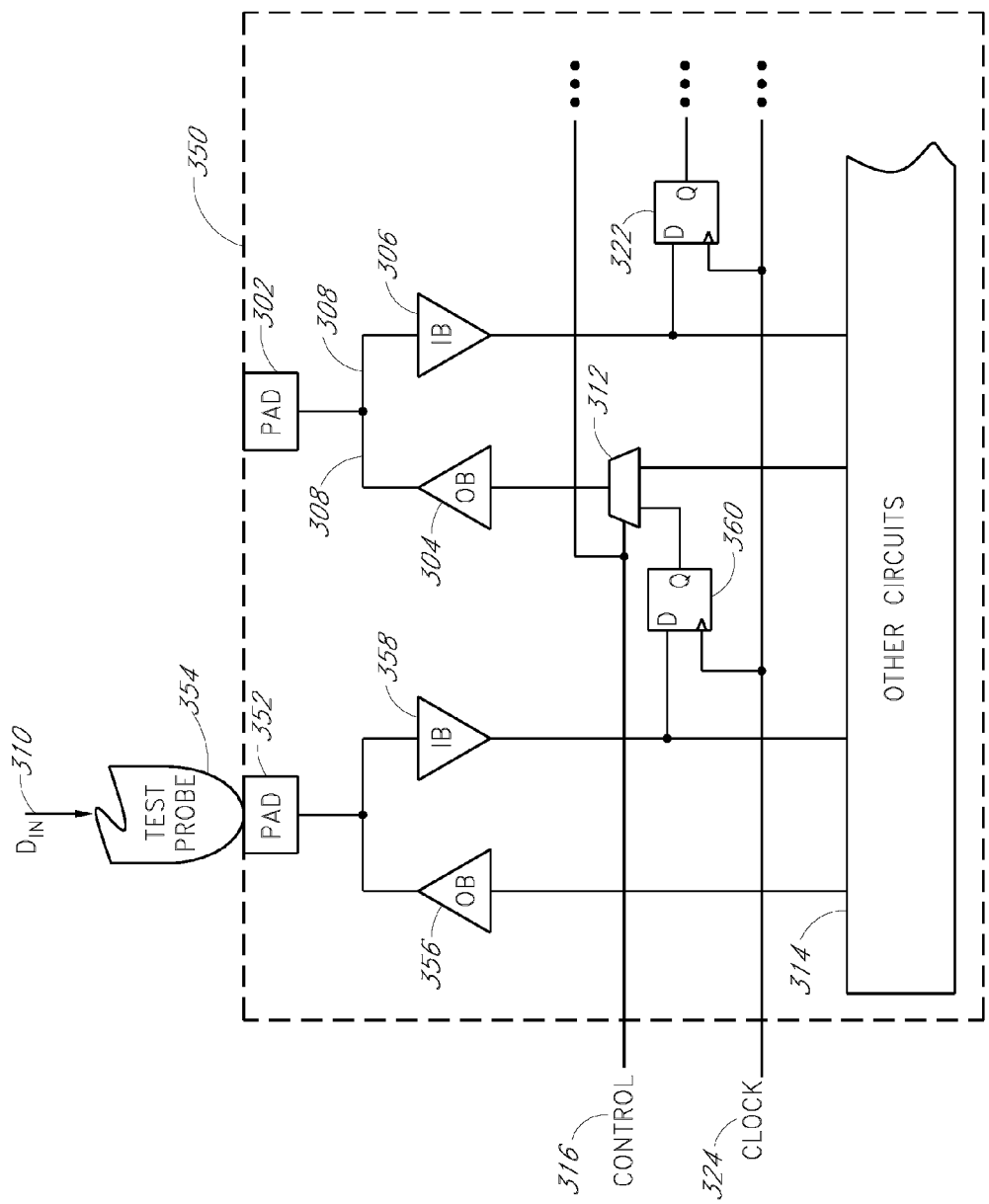
FIG. 3B is a schematic diagram of a circuit that provides testing of an externally accessible interconnect not probed with an externally accessible interconnect that is probed.

A test signal $D_{in}$ 310 is provided in real time as an input to a multiplexer 312. The test signal $D_{in}$ 310 can originate from test equipment outside of the integrated circuit 300. FIG. 3B illustrates an example of coupling the test signal $D_{in}$ 310 from outside the integrated circuit 300 to inside the integrated circuit 300. Another input to the multiplexer 312 is coupled to other circuits 314 for normal operation of the chip, such as to memory array elements for the retrieval of data. The path through the input buffer 306 is used for the storage of data. A control signal 316, which can be shared with a plurality of multiplexers 312, 318, 320, controls the selection of the multiplexers 312, 318, 320 for the test mode or for normal operation. The test signal $D_{in}$ 310 and the control signal 316 can originate from test equipment outside of the integrated circuit 300.

During the test mode, the test signal $D_{in}$ 310 is selected as the output of the multiplexer 312 and is provided as an input to the output buffer 304. During the test mode, both output buffer 304 and input buffer 306 are enabled such that if the conductors 308 have continuity, then the test signal $D_{in}$ 310 propagates through to the output of the input buffer 306. Preferably, the output of the input buffer 306 is coupled to an optional register 322, such as to a D-type flip flop. The register 322 is coupled to a clock signal 324 to capture the test signal $D_{in}$ 310 after it has propagated through the multiplexer 312, the output buffer 304, the conductors 308, and the input buffer 306. The clock signal 324 can originate from test equipment outside of the integrated circuit 300. The output of the input buffer 306 is also coupled to the other circuits 314 for normal operation of the integrated circuit 300 in its intended function, such as for the storage of data in a memory array.

In the illustrated embodiment, the test circuitry is cascaded for testing of multiple pads 302, 332, 334. The test signal $D_{in}$ 310 should propagate through the various multiplexers, output buffers, input buffers, and registers 322, 326, 328 after a delay corresponding to the number of registers used in the string. When the conductors 308, 336, 338 maintain electrical continuity to their respective pads, output buffers, and input buffers, the propagated test signal $D_{in}$ 310 should appear as a test output signal $D_{out}$ 330. If the test output signal $D_{out}$ 330 does not behave as expected, then the results of the continuity test is "fail" and the part should be discarded.

FIG. 3B is a schematic diagram of a circuit internal to an integrated circuit 350 that provides testing of a pad 302 not probed with a pad 352 that is probed. A test probe 354 from test equipment outside the integrated circuit 350 couples the test signal $D_{in}$ 310 to the pad 352. While illustrated in the context of an input/output circuit for the probed pad 350, the input circuit as illustrated in FIG. 2 can also be used, for example, without the switchable device 206 or with the switchable device 206 set to "off." A dedicated circuit for test can also be used. If an output buffer 356 is present, it should be "not enabled" for the testing of the pad 302 such that the output of the output buffer 356 is not shorted or in contention with the signal source for the test signal $D_{in}$ 310. It will be understood, however, that the output buffer 356 will typically be enabled at times for the testing of probed pad 352 itself. Other circuits described in connection with FIG. 3A, such as a multiplexer, can be present but are not required for the testing of a pad 352 that is probed by test equipment.

For the testing of the pad 302 not directly probed, the test signal $D_{in}$ 310 is coupled to the pad 352 via the test probe 354, coupled to a register 360 via the input buffer 358, and propagated to the multiplexer 312 for use as a test signal.

Figure 4:
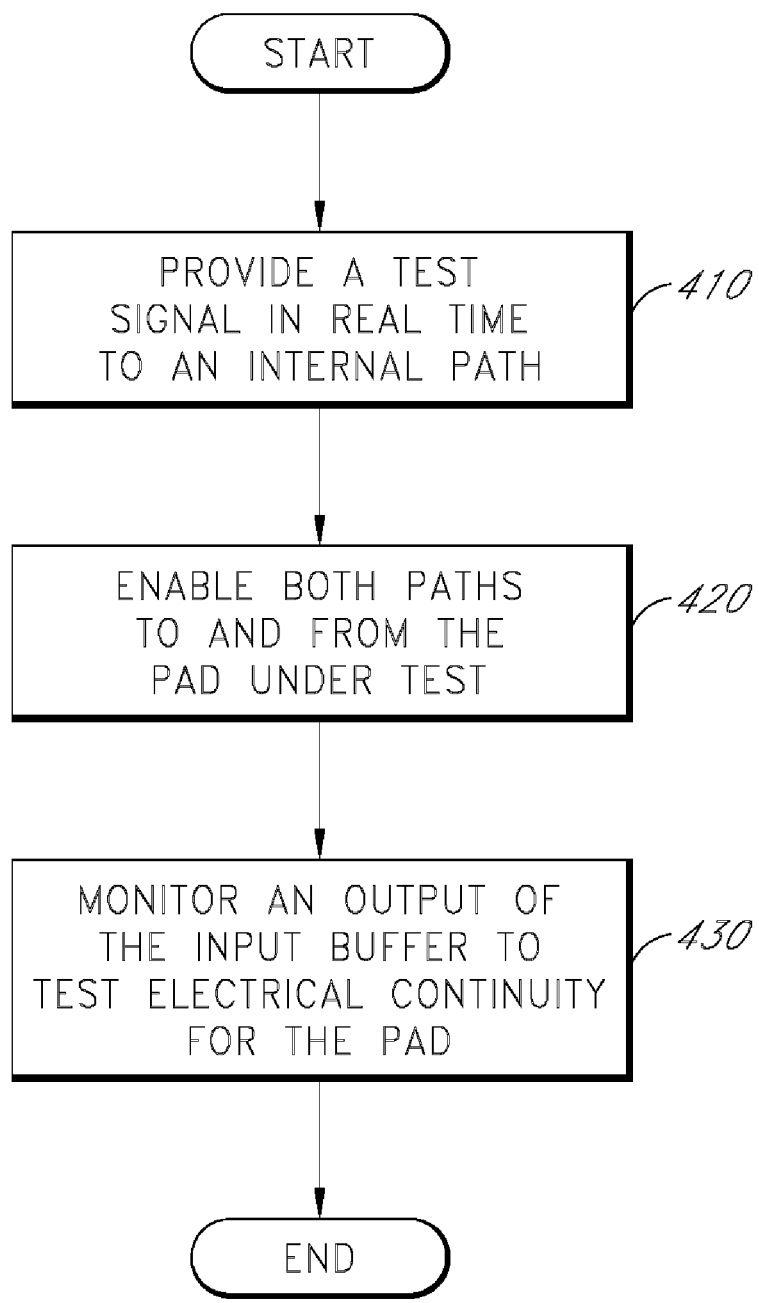
FIG. 4 illustrates an embodiment of a process for testing electrical continuity between an externally accessible interconnect, such as a pad, and a circuit.
Figure 5:
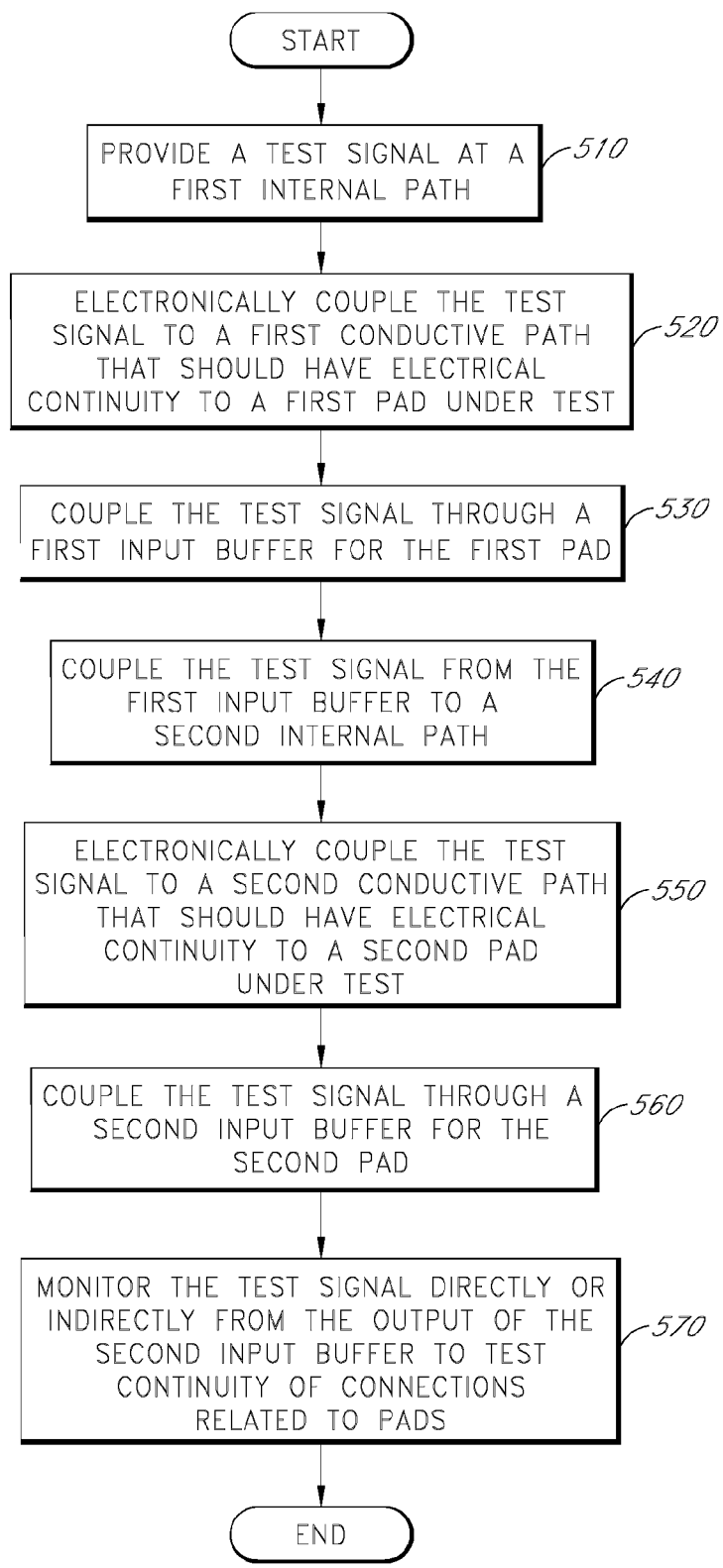
FIG. 5 illustrates another embodiment of a process for testing electrical continuity between externally accessible interconnects, such as pads, and inputs and/or input/outputs.

FIGS. 4 and 5 illustrate examples of processes for testing electrical continuity to pads. It will be appreciated by the skilled practitioner that the illustrated processes can be modified in a variety of ways.

The process illustrated in FIG. 4 begins by providing 410 a test signal along an internal path of an integrated circuit, and not via direct contact with the tested pad. This permits a pad that is not directly contacted by a test probe to be tested for continuity, which is helpful when there are relatively many pads to test and relatively few test probes for test. The test signal can originate from a variety of sources, such as from a preceding internal circuit in a chain of test circuits, from test equipment outside the integrated circuit coupled via another pad, from a pattern generator internal to the integrated circuit, or the like. For example, the test signal can be provided to the switchable device 206 or to the multiplexer 312 as described earlier in connection with FIGS. 2 and 3, respectively.

The process proceeds to enable 420 both paths to and from the pad under test as necessary. For example, for a pad for a data line of a memory chip that has both output and input buffers, both the output buffer 304 and the input buffer 306 are enabled to activate the signal loop to and from the pad as shown in FIG. 3. For a pad with only an input line, such as an address line, it is simpler to activate the switchable device 206 and the input buffer 208 as illustrated in FIG. 2.

The process proceeds to monitor 430 an output of the input buffer 208, 306 to test electrical continuity for the pad under test. As described earlier in connection with FIG. 2, while the pad itself is not directly probed and may not be directly tested, the relatively large size of the pad makes the connection to the pad unlikely to fail relative to the conductive lines and plugs used to connect internal circuits to the pad. Accordingly, by monitoring the output of the input buffer 208, 306 for the test signal, the presence or absence of electrical continuity between the pad and the input buffer 208, 306 can be established with relatively good confidence. The output of the input buffer 208, 306 can be monitored directly or indirectly. For example, rather than monitoring the output directly, the output of the input buffer 208, 306 can be provided to a register, such as a D flip-flop, and then gated through a string of test circuits. After an appropriate number of clock cycles governed by the number of registers through which the test signal propagates, the test signal can be observed for test results. When the output signal behaves as expected, e.g., changes states after the correct number of clock cycles, the continuity of the connections to the pads can be determined to be good. Otherwise, a defect is likely to exist and the part fails the test.

FIG. 5 illustrates testing for continuity to pads with the test circuits arranged in a string configuration. A test signal is provided 510 at a first built-in path (i.e., a path within the integrated circuit being tested). The test signal can originate from test equipment outside of the integrated circuit under test and coupled via a different pad than the tested pad, can be coupled from a preceding circuit in a series of test circuits internal to the integrated circuit, can be generated by a pattern generator internal to the integrated circuit, or the like. The test signal is electronically coupled 520 to a first conductive path that for a passing circuit. For example, the electronic coupling can be via a switchable device 206 as described earlier in connection with FIG. 2 or a multiplexer 312 as described earlier in connection with FIG. 3.

The process couples the test signal to an input of a first input buffer, which is for the first pad, via the first conductive path. The first input buffer is active and couples 530 the test signal from the input to the output of the first input buffer. The test signal is then coupled 540 from the first input buffer to a second built-in path. The second built-in path provides the test signal to a second pad under test. The second built-in path can also include active elements such as registers 214, 322, multiplexers 312, and/or switchable devices 206. In the test mode, the active elements are activated and/or clocked to electronically couple 550 the test signal to the second built-in path.

The second built-in path should have electrical continuity with the second pad under test and an input of a second input buffer, which is for the second pad. It should be noted that after the test signal has propagated beyond the test circuits for a particular pad, then those test circuits can be deactivated. However, all of the test circuits for a particular string can also be activated during the test.

The second input buffer is active and couples 560 the test signal from the input to the output of the second input buffer. The process monitors 570 the signal at the output of the second input buffer (directly or indirectly) to test the continuity of the pads associated with the string of test circuits. It will be understood that further test circuits can form the string, and that the output of the last input buffer is preferably monitored. In addition, it will be understood that other devices, such as registers, multiplexers, or the like, can be used to facilitate the reading of the state of the test signal at the output of a sting of test circuits. When registers are used to store the test signal after a particular pad, the test signal should be expected to arrive after the appropriate number of delays.

Figure 6:
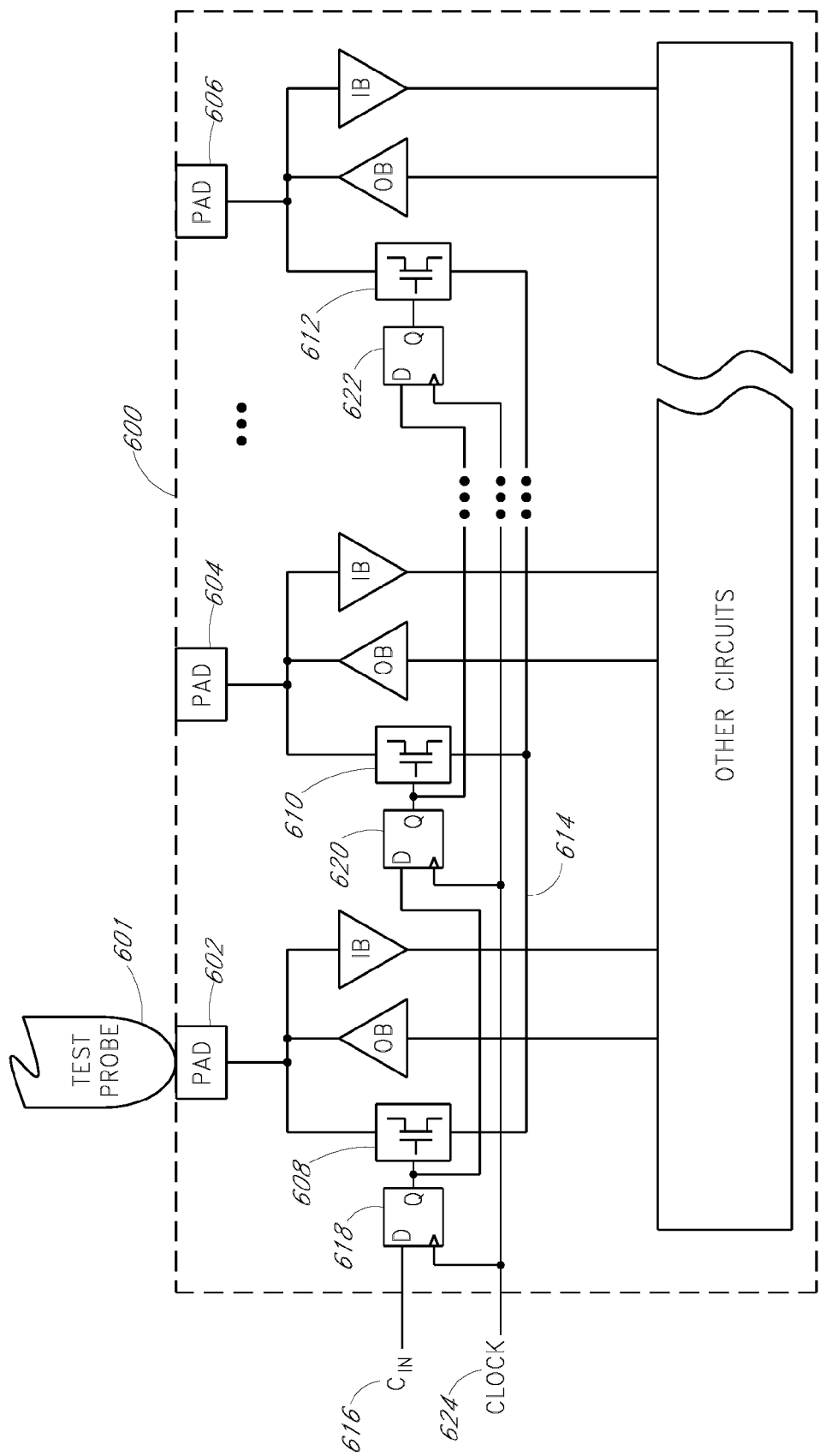
FIG. 6 illustrates a schematic diagram of a circuit that provides testing of leakage current for a plurality of externally accessible interconnects, such as pads.

FIG. 6 illustrates a schematic diagram of a circuit that provides testing of leakage current for a plurality of pads. The illustrated circuit provides leakage current testing of pads of an integrated circuit 600 that are not directly probed by a test probe 601. Typically during test, a measured leakage current amount is compared to a specified maximum leakage amount. While input/output lines are illustrated in FIG. 6, the circuit can be used to test leakage current of pads for input lines, such as address lines, or input/output lines, such as data lines, or both. The circuit permits the test probe 601 contacting a probed pad 602 to test one or more other pads 604, 606 without making contact with the one or more other pads 604, 606. This permits relatively few test probes to test relatively more, e.g., pads 2-100, or preferably all of the pads of the integrated circuit 600. Thus one probe can test more than one pad at one time. The described leakage current testing techniques can also be used in combination with the pad continuity testing techniques described earlier in connection with FIGS. 2-5.

Switchable devices 608, 610, 612, such as transistors, couple current applied to the probed pad 602 to an internal test line 614 within the integrated circuit 600, and then on to one or more other pads 604, 606 as determined by control signals applied to the switchable devices 608, 610, 612. For example, for a baseline test, a test probe is contacted with the first pad, and the probed pad 602 by itself is tested by setting the switchable device 608 to "off" or non-conductive, and the other switchable devices 610, 612 can be "on" or "don't care" states. Alternatively, the switchable device 608 can be turned "on" or don't care and the other switchable devices 610, 612 are turned "off." It will be noted, however, that conductive lines are preferably not left floating, and another device can, for example, tie the built-in test line 614 to a potential such as ground when not in use.

The isolation of the probed pad 602 establishes the leakage current amount for the probed pad 602. Then, for example, the switchable device 608 and the switchable device 610 can be turned "on" such that a conductive path is established between the probed pad 602 and the second pad 604. The resulting leakage current amount will then be the sum of the leakage current amounts for the probed pad 602 and the second pad 604. While it will be recognized that two switches in series in the "off" state are not necessary to isolate the pad, in one embodiment, each pad has a switch to isolate the pad and other circuits from parasitic capacitances and the like.

The leakage current amount for the second pad 604 can then be determined by subtracting the leakage current amount obtained for the probed pad 602 from the total. Due to the relatively large size of the probed pad 602 and the second pad 604 and resulting relatively large leakage current amounts for pads, the leakage currents of other components such as conductors, the built-in test line 614, and the switchable devices 608, 610, 612 can typically be ignored. For leakage current testing of the third pad 606, the switchable device 610 is preferably turned "off" or non-conductive and the switchable devices 612 is turned "on" with the switchable device 608 remaining on.

In the illustrated embodiment, control registers 618, 620, 622 are arranged in series to provide serial control of the switchable devices 608, 610, 612 via a control signal $C_{in}$ 616. A clock signal 624 can control the propagation of the control signal $C_{in}$ 616 through the control registers 618, 620, 622. The control signal $C_{in}$ 616 and the clock signal 624 can originate from test equipment outside the integrated circuit 600.

In another embodiment, the switchable devices 608, 610, 612 are individually controlled by, for example, registers responsive to individual control bits of a control word. In one embodiment, the switchable device 608 for the probed pad 602 is under separate control so that the switchable device 608 can remain "on" while other switchable devices 610, 612 are sequentially turned on. It is typically preferable to test only two pads at the same time such that the leakage current can remain relatively low and precisely measured. However, it will be understood that more than two pads can be tested at a time.

Figure 7:
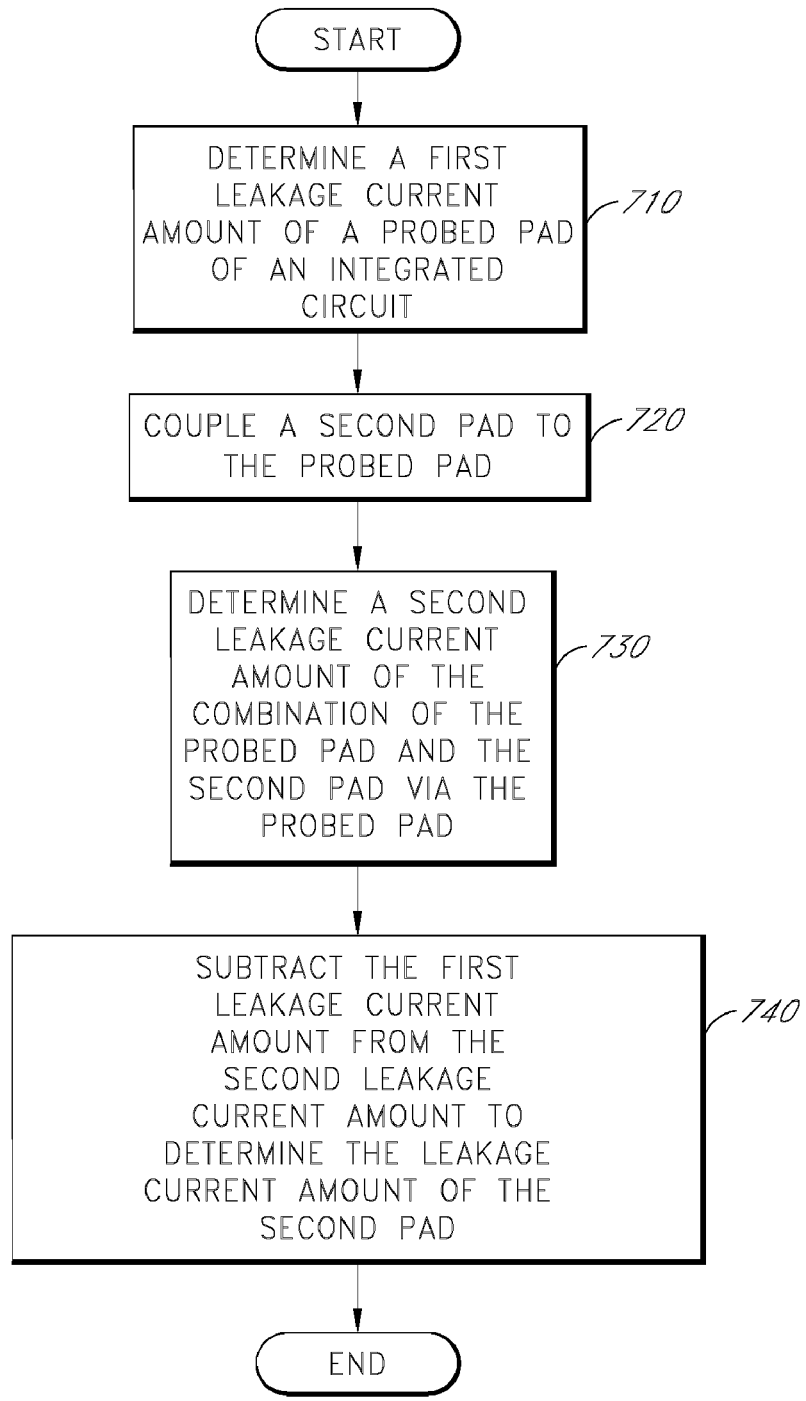
FIG. 7 illustrates an embodiment of a process for testing leakage current for a plurality of externally accessible interconnects, such as pads.

FIG. 7 illustrates an embodiment of a process for testing leakage current for a plurality of pads, including one or more pads that are not directly probed with test equipment. It will be appreciated by the skilled practitioner that the illustrated processes can be modified in a variety of ways. For example, the order of steps can be interchanged. For example, the process is described with the leakage current for a probed pad being determined first, and then for combinations of pads being determined later. However, the order can be interchanged.

The leakage current of a probed pad is determined 710. For example, test equipment can directly probe on a pad. In one embodiment, the leakage current determined 710 is the leakage current only for the probed pad and not for other pads.

The process then couples 720 the probed pad to a second pad using a path within the integrated circuit, i.e., not with a path of the test equipment. For example, as illustrated in connection with FIG. 6, switchable devices 608, 610 can be activated to be conductive, and the probed pad 602 and the second pad 604 can be coupled together via the built-in test line 614. Other pads can also be coupled, but in the illustrated embodiment, only two pads are coupled at a time.

The leakage current is then determined 730 again, and the test results include a leakage current that is the sum of the leakage currents for the probed pad and also for any pads electronically coupled to the probed pad. In the illustrated example, the measured leakage current is the sum of the probed pad and a second pad.

The process then subtracts 740 the leakage current obtained in the step 710 from the leakage current obtained in the step 730 to determine a second leakage current amount for the second pad. Typically, the leakage current contributions of other components, such as the built-in test line 614 or switchable devices 608, 610, 612 are negligibly small and can be ignored.

The illustrated process can be extended to determine leakage current amounts for more pads. For example, relatively many pads, e.g., 2-100 pads, can be coupled to the probed pad.

One embodiment of the invention includes a method of testing electrical continuity for an externally accessible interconnect such as a pad, of an integrated circuit, wherein the method includes: providing a test signal in real time to a path internal to the integrated circuit and not via the externally accessible interconnect itself, wherein the path includes at least an input of an input buffer for the externally accessible interconnect; and monitoring an output of the input buffer as a test for the electrical continuity between the externally accessible interconnect and the input buffer.

One embodiment of the invention includes a method of testing electrical continuity for externally accessible interconnects of an integrated circuit, wherein the method includes: coupling a test signal to a first path within the integrated circuit, wherein the first path is intended to have electrical continuity at least between a first externally accessible interconnect under test and a first input buffer; coupling the test signal through the first input buffer; electronically coupling the test signal from an output of the first input buffer to a second path within the integrated circuit, wherein the second path is intended to have electrical continuity at least between a second externally accessible interconnect under test and a second input buffer; coupling the test signal through the second input buffer; and monitoring an output of the second input buffer as a test for the first externally accessible interconnect and the second externally accessible interconnect.

One embodiment of the invention includes an integrated circuit configurable to permit testing of intended continuity of one or more externally accessible interconnects without contact to the one or more externally accessible interconnects, wherein the integrated circuit includes: an externally accessible interconnect; an input buffer with an input coupled to the externally accessible interconnect; and a circuit within the integrated circuit that is coupled to the externally accessible interconnect and to the input buffer, wherein in a test mode of operation, the circuit is configured to provide a test signal to the externally accessible interconnect, and wherein in a normal mode of operation, the test signal is not impressed on the externally accessible interconnect.

One embodiment of the invention includes a method of testing leakage current for externally accessible interconnects of an integrated circuit, wherein the method includes: determining a first leakage current amount of a probed externally accessible interconnect of the integrated circuit; selectively coupling an unprobed externally accessible interconnect to the probed externally accessible interconnect via a path internal to the integrated circuit; determining a second leakage current amount from the probed externally accessible interconnect; and subtracting the first leakage current amount from the second leakage current amount to determine the leakage current amount for the unprobed externally accessible interconnect.

One embodiment of the invention includes an integrated circuit configurable to facilitate test of leakage current of externally accessible interconnects of the integrated circuit, wherein the integrated circuit includes: a first externally accessible interconnect; a second externally accessible interconnect; a first switchable device electrically coupled to the first externally accessible interconnect; and a second switchable device electrically coupled to the first switchable device and to the second externally accessible interconnect such that when the first switchable device and the second switchable device are activated during a test mode of operation, a conductive path is formed from the first externally accessible interconnect and the second externally accessible interconnect, and wherein in a normal mode of operation, at least one of the first switchable device or the second switchable device is deactivated such that there is no conductive path between the first externally accessible interconnect and the second externally accessible interconnect.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

We claim:

1. An integrated circuit configurable to permit testing of intended continuity of one or more externally accessible interconnects without contact to the one or more externally accessible interconnects, the integrated circuit comprising:
    an externally accessible interconnect;
    an input buffer with an input coupled to the externally accessible interconnect; and
    a circuit within the integrated circuit that is coupled to the externally accessible interconnect and to the input buffer, wherein in a test mode of operation, the circuit is configured to provide a test signal to the externally accessible interconnect, and wherein in a normal mode of operation, the test signal is not impressed on the externally accessible interconnect.

2. The integrated circuit of claim 1, wherein the circuit comprises at least a multiplexer and an output buffer, wherein the multiplexer is configured to select from an input for the test signal or an input for a normal function, and to provide an output to an input of the output buffer, and wherein the output of the output buffer is coupled to the externally accessible interconnect and to the input buffer.

3. The integrated circuit of claim 2, wherein the circuit is further configured to receive a control signal and the test signal, wherein the multiplexer is controlled by the control signal.

4. The integrated circuit of claim 2, wherein the circuit further comprises a register, wherein an input to the register is coupled to a test signal propagated from another externally accessible interconnect, and wherein an output of the circuit is provided to the multiplexer.

5. The integrated circuit of claim 4, wherein the circuit is further configured to receive a control signal, a clock signal, and the test signal, wherein the multiplexer is controlled by the control signal, and wherein the register is latched by the clock signal.

6. The integrated circuit of claim 1, wherein the circuit comprises at least a switchable device.

7. The integrated circuit of claim 6, wherein the circuit is further configured to receive a control signal and the test signal, wherein the switchable device is controlled by the control signal.

8. The integrated circuit of claim 6, wherein the circuit further comprises a register, wherein the test signal is propagated through the register from a circuit for another externally accessible interconnect, and wherein an output of the register is provided to the multiplexer.

9. The integrated circuit of claim 8, wherein the circuit is further configured to receive a control signal, a clock signal, and the test signal, wherein the switchable device is controlled by the control signal, and wherein the register is latched by the clock signal.

10. The integrated circuit of claim 1, wherein the circuit is further configured to receive the test signal via an externally accessible interconnect and an input buffer other than the externally accessible interconnect and input buffer selected for test.

11. The integrated circuit of claim 1, wherein the externally accessible interconnect comprises a pad.

12. The integrated circuit of claim 1, further comprising memory circuits coupled to the input buffer.

13. The integrated circuit of claim 1, wherein the integrated circuit is further configurable to facilitate test of leakage current of externally accessible interconnects, the integrated circuit further comprising:
    a second externally accessible interconnect;
    a first switchable device electrically coupled to the externally accessible interconnect; and
    a second switchable device electrically coupled to the first switchable device and to the second externally accessible interconnect such that when the first switchable device and the second switchable device are activated during a test mode of operation, a conductive path is formed from the externally accessible interconnect and the second externally accessible interconnect, and wherein in a normal mode of operation, at least one of the first switchable device or the second switchable device is deactivated such that there is no conductive path between the externally accessible interconnect and the second externally accessible interconnect.

* * * * *